United States Patent
Liu et al.

(10) Patent No.: US 9,036,346 B2
(45) Date of Patent: May 19, 2015

(54) ELECTRONIC DEVICE AND COVER ASSEMBLY

(71) Applicant: ASUSTek COMPUTER INC., Taipei (TW)

(72) Inventors: Yu-Se Liu, Taipei (TW); Hsin-Hung Hsiao, Taipei (TW)

(73) Assignee: ASUSTeK COMPUTER INC., Taipei (TW)

( * ) Notice: Subject to any disclaimer, the term of this patent is extended or adjusted under 35 U.S.C. 154(b) by 157 days.

(21) Appl. No.: 13/902,434

(22) Filed: May 24, 2013

(65) Prior Publication Data

US 2013/0321993 A1    Dec. 5, 2013

Related U.S. Application Data

(60) Provisional application No. 61/653,537, filed on May 31, 2012.

(30) Foreign Application Priority Data

Apr. 19, 2013 (TW) .............................. 102113994 A (51) Int. Cl.

| | |
|---|---|
| *H05K 5/00* | (2006.01) |
| *H05K 5/03* | (2006.01) |
| *F16M 11/10* | (2006.01) |
| *F16M 11/20* | (2006.01) |
| *G06F 1/18* | (2006.01) |
| *H05K 7/00* | (2006.01) |
| *G06F 1/16* | (2006.01) |
| *A47F 5/00* | (2006.01) |

(52) U.S. Cl.
CPC ................. *H05K 5/03* (2013.01); *F16M 11/10* (2013.01); *F16M 11/2021* (2013.01); *F16M 2200/08* (2013.01); *G06F 1/1601* (2013.01); *G06F 1/181* (2013.01); *Y10S 248/917* (2013.01); *Y10S 248/919* (2013.01); *Y10S 248/92* (2013.01)

(58) Field of Classification Search
USPC ............. 361/679.01, 679.02, 679.04, 679.06, 361/679.07, 679.27, 679.28, 679.59; 248/917, 919, 920, 921, 922, 923, 248/346.04, 121, 122.1, 124.1, 125.2
See application file for complete search history.

(56) References Cited

U.S. PATENT DOCUMENTS

| | | | |
|---|---|---|---|
| 8,279,591 B2 * | 10/2012 | Chiu ......................... | 361/679.27 |
| 2006/0133016 A1 * | 6/2006 | North et al. ................... | 361/681 |
| 2012/0056520 A1 | 3/2012 | Liu et al. | |

FOREIGN PATENT DOCUMENTS

| | | |
|---|---|---|
| TW | M402456 U1 | 4/2011 |
| TW | M430129 U1 | 5/2012 |

*Primary Examiner* — Hoa C Nguyen
*Assistant Examiner* — Binh Tran
(74) *Attorney, Agent, or Firm* — Muncy, Geissler, Olds & Lowe, P.C.

(57) ABSTRACT

A cover assembly applied to an electronic device is disclosed. The electronic device includes a first component and a second component, and an opening is formed between the first component and the second component. The cover assembly includes a cover element, at least one first moving element, at least one second moving element and an elastic element. The cover element is disposed in the opening, attached to the second component, and abutted against the first component. The first moving element is connected to the cover element and includes at least one first moving part. The second moving element is connected to the second component and includes at least one second moving part. The elastic element is connected between the first moving element and the second moving element, and provides an elastic force to make the cover element continuously abutted against the first component and cover the opening.

8 Claims, 7 Drawing Sheets

ELECTRONIC DEVICE AND COVER ASSEMBLY

CROSS-REFERENCE TO RELATED APPLICATION

This application claims the priority benefit of U.S. provisional application Ser. No. 61/653,537, filed on May 31, 2012, and Taiwan application serial no. 102113994, filed on Apr. 19, 2013. The entirety of the above-mentioned patent application is hereby incorporated by reference herein and made a part of specification.

BACKGROUND OF THE INVENTION

1. Field of the Invention

The invention relates to a cover assembly and, more particularly, to a cover assembly applied to an electronic device.

2. Description of the Related Art

As technology develops, requirements of various electronic devices, such as a desktop computer or a portable computer, are improving. Users not only require for efficiency of the electronic device, but also consider the beauty in appearance of the electronic device. Except for an outlook design, the user also hopes that an inner structure of the electronic device cannot be seen from outside.

Taking a desktop computer as an example, it includes a host and a display screen. The host and the display screen may be separated or integratedly formed. The user usually pays more attention to the appearance of the display screen.

Figure 1:
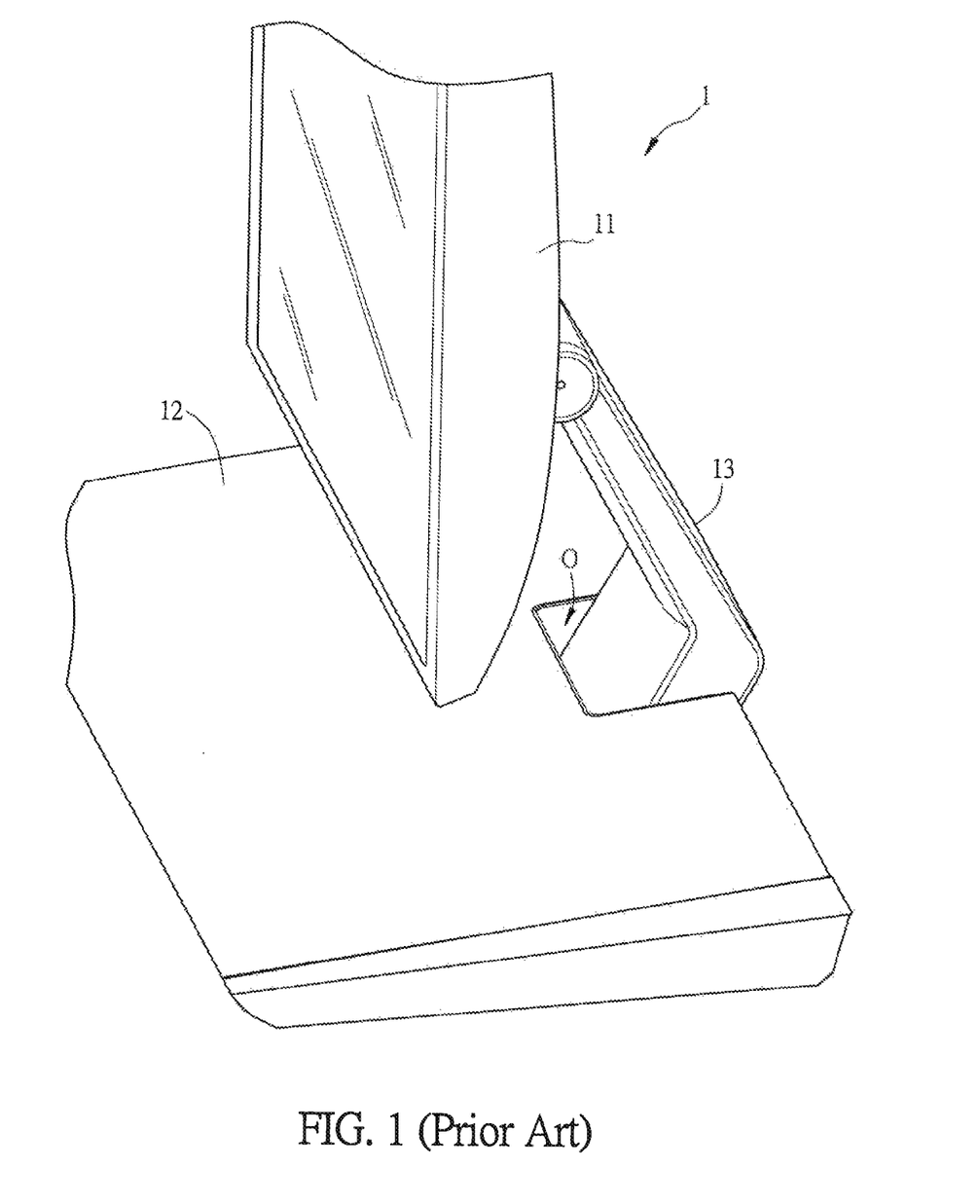
FIG. 1 is a schematic diagram showing a conventional electronic device with a display screen.

FIG. 1 is a schematic diagram showing a conventional electronic device with a display screen. The electronic device 1 includes a display screen 11 and a base 12, and the display screen 11 is connected to the base 12 via a supporting element 13. The supporting element 13 can move towards the base 12 to adjust the display screen 11, accommodate the electronic device 1 and save space. An opening O is formed between the base 12 and the supporting element 13 of the electronic device 1 for the supporting element 13 to move. Thus, the inner structure in the base 12 of the electronic device 1 may be shown, which affects the beauty in appearance and makes dust accumulate.

Moreover, main components of an electronic device, such as a central processing unit (CPU), a memory, a hard disk drive and an optical disk drive, may be disposed in the base 12. Thus, if dust floats into the base 12 via the opening O, the operation of the electronic device 1 is affected.

BRIEF OF THE INVENTION

A cover assembly applied to an electronic device is disclosed. The electronic device includes a first component and a second component. The second component has an opening, and the opening is between the first component and the second component. The cover assembly includes a cover element, at least one first moving element, at least one second moving element and an elastic element. The cover element is disposed in the opening, attached to the second component and abutted against the first component. The first moving element is connected to the cover element and includes at least one first moving part. The second moving element is connected to the second component and includes at least one second moving part. The first moving part is disposed corresponding to the second moving part, and the second moving part guides the first moving part to move. The elastic element is connected between the first moving element and the second moving element, and when the first component rotates relatively to the second component, the elastic element provides an elastic force to make the cover element continuously abutted against the first component and cover the opening.

An electronic device includes a first component, a second component and a cover assembly. The second component has an opening, and the opening is between the first component and the second component. The cover element is disposed in the opening, attached to the second component and abutted against the first component. The first moving element is connected to the cover element and includes at least one first moving part. The second moving element is connected to the second component and includes at least one second moving part. The first moving part is disposed corresponding to the second moving part, and the second moving part guides the first moving part to move. The elastic element is connected between the first moving element and the second moving element, and when the first component rotates relatively to the second component, the elastic element provides an elastic force to make the cover element continuously abutted against the first component and cover the opening.

These and other features, aspects and advantages of the present invention will become better understood with regard to the following description, appended claims, and accompanying drawings.

DETAILED DESCRIPTION OF THE EMBODIMENTS

An electronic device and a cover assembly are illustrated with relating figures, and the same symbols denote the same components.

Figure 2:
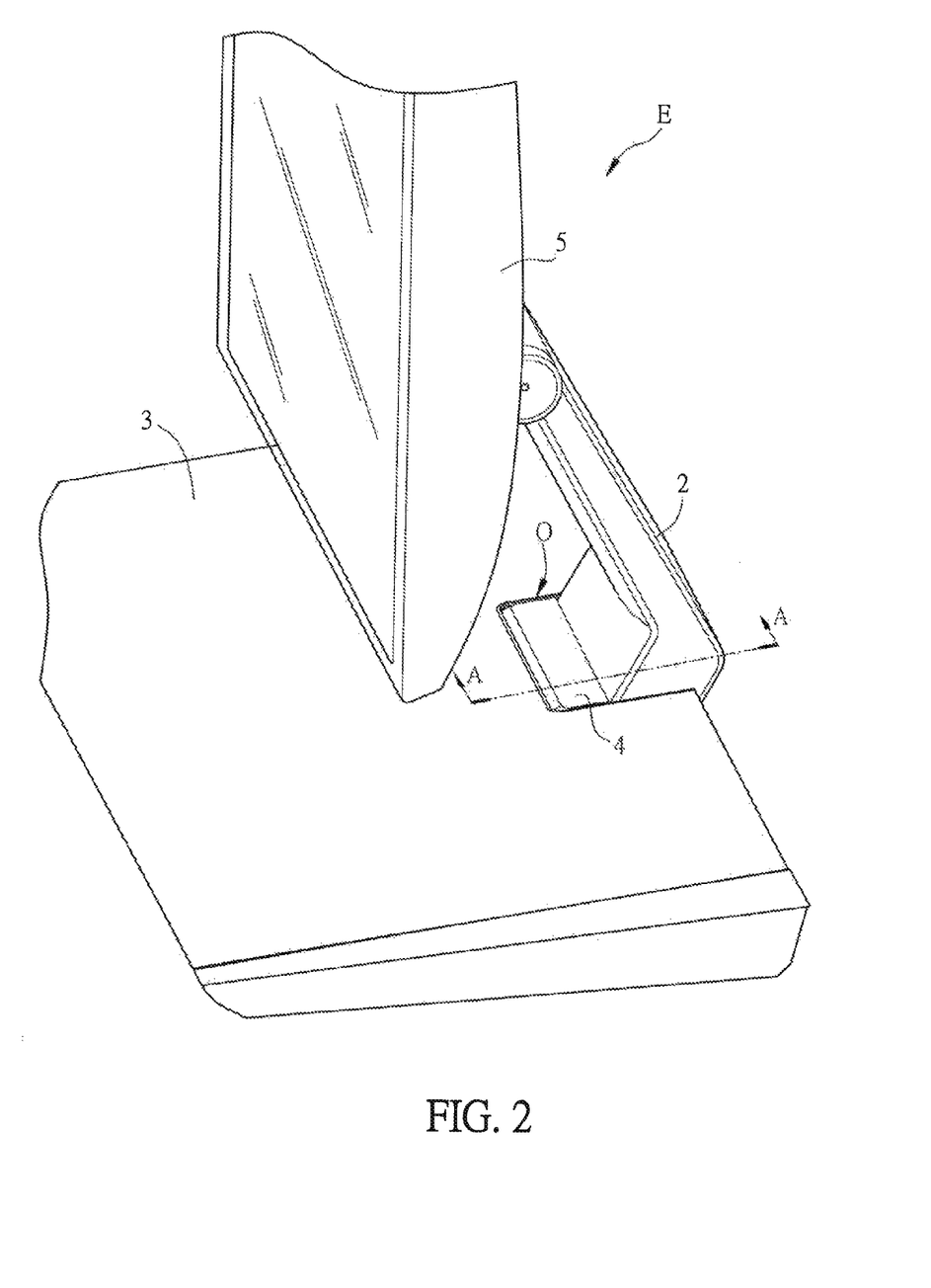
FIG. 2 is a schematic diagram showing an electronic device in an embodiment.
Figure 3:
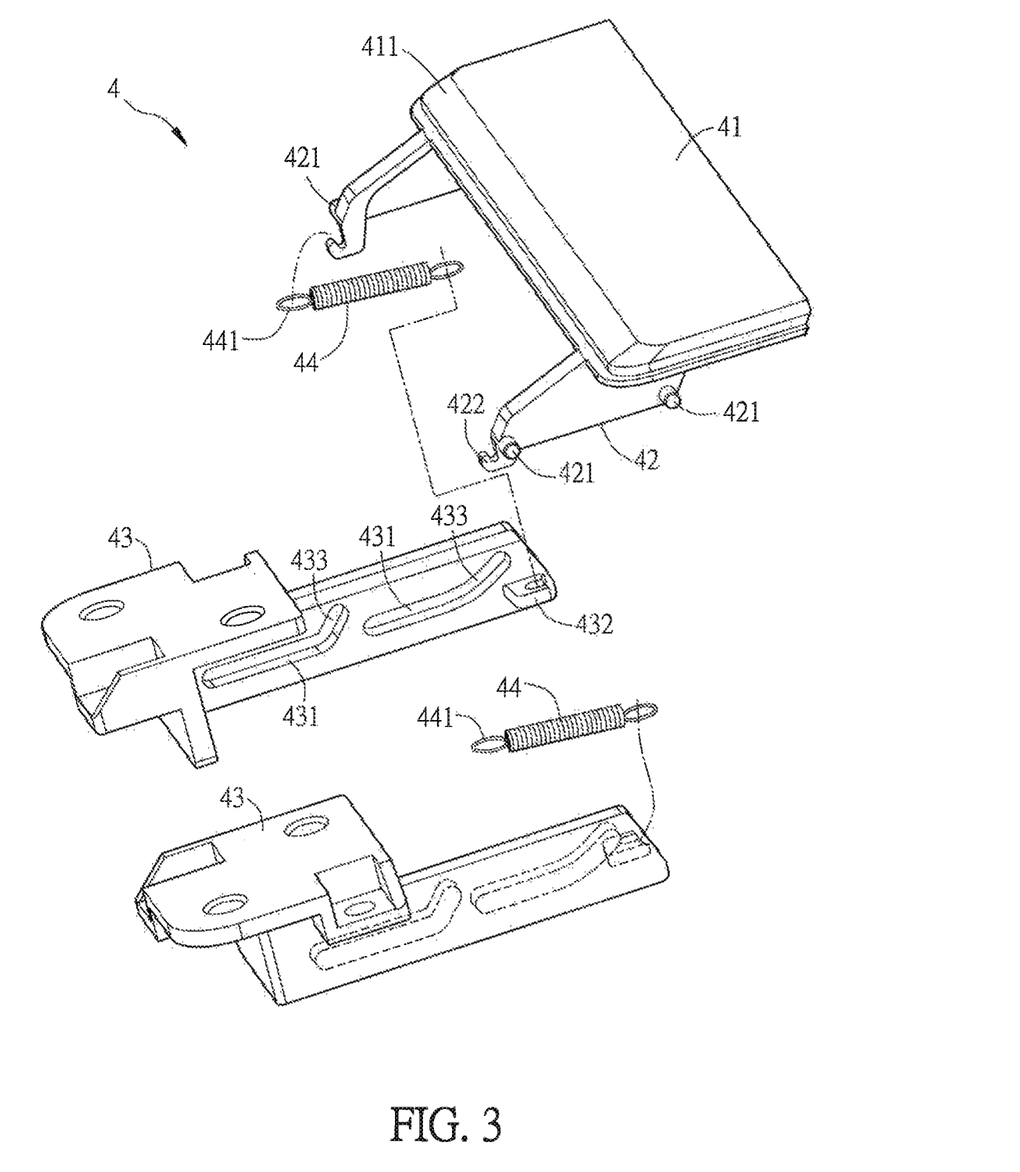
FIG. 3 is an exploded diagram showing a cover assembly in FIG. 2.

FIG. 2 is a schematic diagram showing an electronic device in an embodiment, and FIG. 3 is an exploded diagram showing a cover assembly in FIG. 2. Please refer to FIG. 2 and FIG. 3, in the embodiment, the electronic device E includes a first component 2, a second component 3 and a cover assembly 4. The cover assembly 4 is disposed corresponding to the first component 2. The first component 2 is a supporting element, and the second component 3 is a base, which is not limited herein. The second component 3 of the electronic device has an opening O at a connection portion between the first component 2 and the second component 3 (as shown in FIG. 1). The cover assembly 4 is disposed at the opening O of the second component 3 to cover the opening O. In FIG. 3, the cover assembly 4 includes a cover element 41, at least one first moving element 42, at least one second moving element 43 and an elastic element 44. The cover element 41 is disposed in the opening O, one side of the cover element 41 is attached to the second component 3, and the other side abuts against the first component 2 (as shown in FIG. 2). The first moving element 42 is connected to the cover element 41, and the second moving element 43 is connected to the second component 3 near the opening O. In the embodiment, two first moving elements 42 are disposed at two ends of the cover element 41 respectively. In other embodiments, one first moving element 42 or other number of the first moving elements 42 may be disposed at the cover element 41, which is not limited herein. The number of the first moving elements 42 should correspond to the number of the second moving element 43.

As shown in FIG. 3, the first moving elements 42 are connected to the cover element 41, and each of the first moving elements 42 includes at least one first moving part 421. The second moving elements 43 are connected to the second component 3, and each of the second moving elements 43 includes at least one second moving part 431. The first moving part 421 is disposed corresponding to the second moving part 431. In the embodiment, the first moving part 421 is a protruding part, and the second moving part 431 is a sliding slot. The protruding part is disposed in the sliding slot to make the first moving part 421 slide corresponding to the second moving part 431. That is, the second moving part 431 guides the first moving part 421 to move. The first moving element 42 includes two first moving parts 421, and the second moving element 43 includes two second moving parts 431. The two first moving parts 421 are disposed in the two second moving parts 431 respectively. Thus, the electronic device E includes two first moving elements 42 disposed at two ends of the cover element 41 respectively, and two second moving elements 43 disposed corresponding to the first moving elements 42. Each of the first moving elements 42 has two first moving parts 421, and each of the second moving elements 43 has two second moving parts 431. The first moving parts 421 can slide stably in the second moving parts 431 to maintain the stability of the cover assembly 4.

Figure 4:
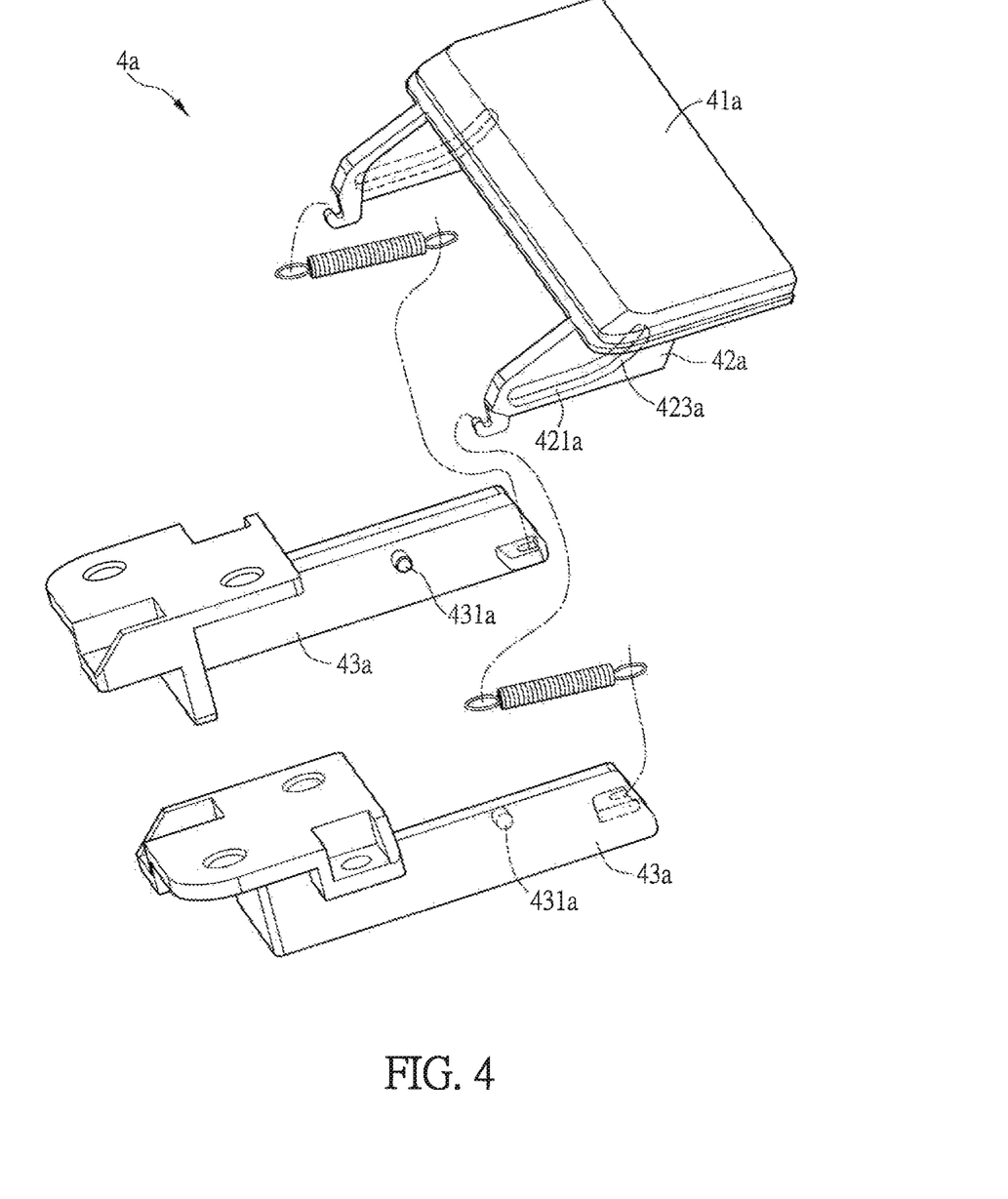
FIG. 4 is an exploded diagram showing the cover assembly in FIG. 3 in another embodiment.

FIG. 4 is an exploded diagram showing the cover assembly in FIG. 3 in another embodiment. The number of the first moving part 421a and the second moving part 431a is not limited, as long as they are corresponding to each other. For example, each of the first moving elements 42a may only has one first moving part 421a, and each of the second moving elements 43a has one second moving part 431a correspondingly. In the embodiment, the first moving part 421a is a sliding slot, and the second moving part 431a is a fixed protruding part. The protruding part is disposed in the sliding slot to make the sliding slot (the first moving part 421a) slide corresponding to the protruding part (the second moving part 431a), and the cover element 41a and the first moving element 42a move corresponding to the second moving element 43a and the second component 3 in FIG. 2.

Figure 5A:
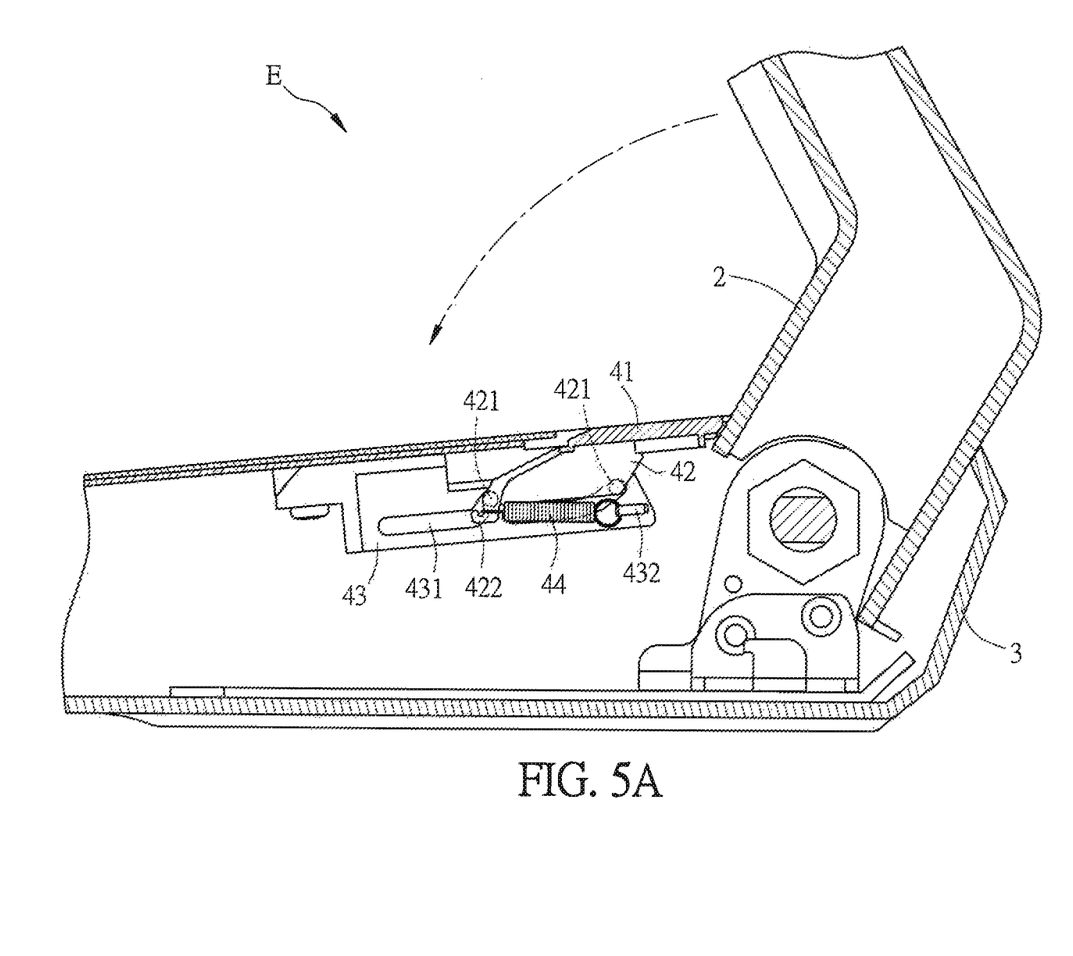
FIG. 5A is a sectional diagram showing the electronic device in FIG. 2 along an A-A line.
Figure 5B:
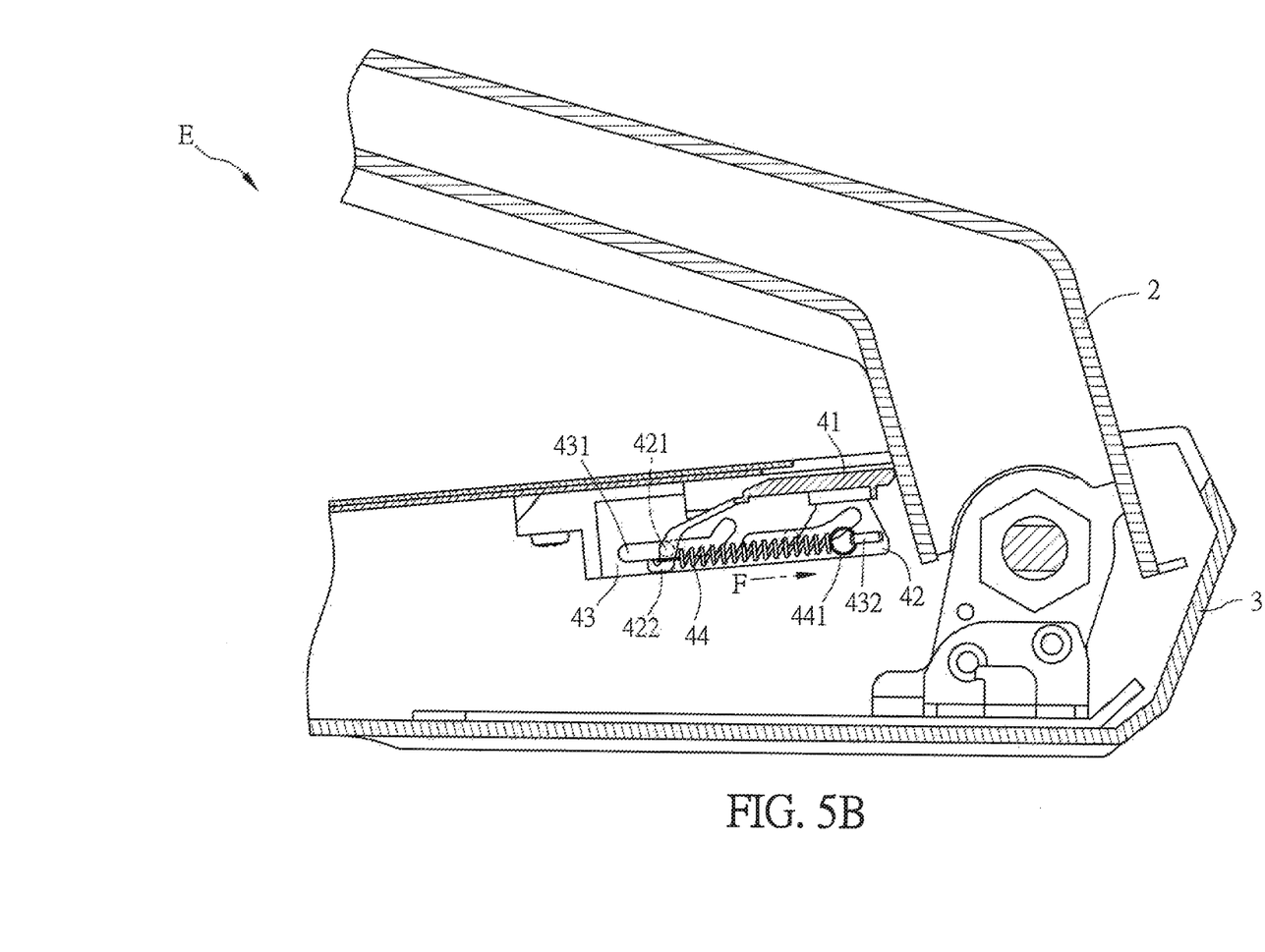
FIG. 5B is a schematic diagram showing moving of the cover assembly in FIG. 5A.

FIG. 5A is a sectional diagram showing the electronic device in FIG. 2 along the A-A line, and FIG. 5B is a schematic diagram showing moving of the cover assembly in FIG. 5A. Please refer to FIG. 5A and FIG. 5B, the elastic element 44 is connected between the first moving element 42 and the second moving element 43. The elastic element 44 provides an elastic force F to make the cover element 41 abutted against the first component 2. Please refer to FIG. 3, the first moving element 42 further includes a first fixing part 422, and the second moving element 43 further includes a second fixing part 432. The elastic element 44 is sleeved to the first fixing part 422 and the second fixing part 432 to be connected to the first moving element 42 and the second moving element 43. Two lantern rings 441 are disposed at two ends of the elastic element 44, and the first fixing part 422 and the second fixing part 432 are hooks. Thus, the lantern rings 441 of the elastic element 44 can be sleeved to the first fixing part 422 and the second fixing part 432.

As shown in FIG. 5A, the elastic element 44 is at a normal state and is not tight. When the user applies a force towards lower left at the first component 2 (as shown in a dotted line arrow in FIG. 5A), which means the three is towards the second component 3 (as shown in FIG. 2), the first component 2 rotates relatively to the second component 2 and pushes the cover element 41, as shown in FIG. 5B. The first moving part 421 of the first moving element 42 is guided to slide in the second moving part 431. Since the second moving element 43 is fixed at the second component 3 and one end of the elastic element 44 is sleeved to the second fixing part 432, when the first moving element 42 slides, the other end of the elastic element 44 sleeved to the first fixing part 422 moves. Then, the elastic element 44 is at a tight state and an elastic force F towards right is applied to the cover element 41 to make it abutted against the first component 2. Thus, the inner components in the electronic device E are covered to maintain the beauty in appearance of the electronic device E and prevent dust to avoid affecting the whole operation of the electronic device E.

Please refer to FIG. 3 and FIG. 2, the second moving part 431 further has a guiding part 433. The guiding part 433 may be a slope, and it guides the first moving part 421 to slide downwards and then slide to the second moving part 431. The first moving part 421 is guided to the second moving part 431 via the guiding part 433, which can avoid a contact or a crash between the cover element 41 and the second component 3 and prevent damage of the cover element 41 and the second component 3. The cover element 41 further has an inclined surface to avoid a contact between the cover element 41 and the second component 3 and make the cover element 41 move into the second component 3 smoothly.

Please refer to FIG. 4, the first moving part 421a has a guiding part 423a to guide the second moving part 431a into the first moving part 421a, so as to avoid a contact or a crash between the cover element 41a and the second component 3a. In a word, the sliding slot may further has a guiding part 433 or 423a to avoid damage of the cover element 41, 41a and the second component 3, 3a.

Figure 6:
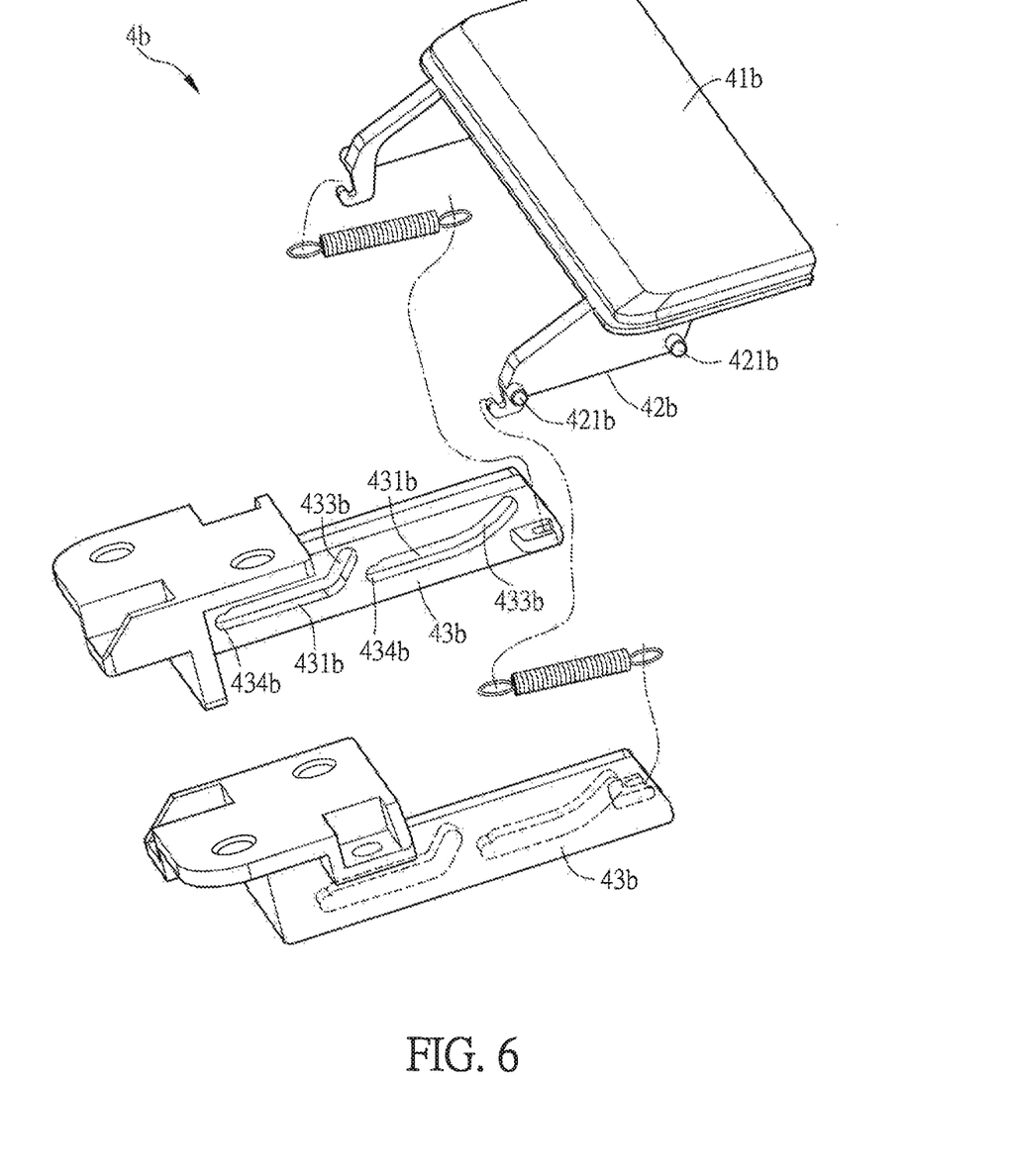
FIG. 6 is a schematic diagram showing a second moving element in FIG. 3 in another embodiment.

FIG. 6 is a schematic diagram showing a second moving element in FIG. 3 in another embodiment. Please refer to FIG. 6, a limiting part 434b is disposed at one end of the second moving part 431b away from the guiding part 433b. When the cover assembly 4b moves, the cover element 41b guides the first moving part 421b to move to the end of the second moving part 431b, and the first moving part 421b is fixed by the limiting part 434b, which can fasten the first moving part 421b and the second moving part 431b.

A cover assembly applied to an electronic device is further disclosed. The electronic device includes a first component and a second component. The second component has an opening between the first component and the second component. The cover assembly includes a cover element, at least one first moving element, at least one second moving element and an elastic element. The cover element is disposed in the opening, attached to the second component and abutted against the first component. The first moving element is connected to the cover element and includes at least one first moving part. The second moving element is connected to the second component and includes at least one second moving part. The first moving part is disposed in the second moving part, and the second moving part guides the first moving part to move. The elastic element is connected between the first moving element and the second moving element. When the first component rotates relatively to the second component, the elastic element provides an elastic force to make the cover element abutted against the first component and cover the opening. The components of the cover assembly and the connection therebetween are illustrated in above, which is omitted herein.

In sum, the cover assembly slidably covers the opening between the first component and the second component of the electronic device via the cover element, the first moving element and the second moving element. The cover element continuously abuts against the first component of the electronic device and covers the opening via the elastic element connected between the first moving element and the second moving element. In the embodiments of the invention, no matter how the first component moves, the inner components of the electronic device (or the base) are covered by the cover assembly. Thus, the electronic device can maintain a beauty in appearance and prevent dust from accumulating at the inner components, so as to maintain the operation stability of the electronic device.

Moreover, the second moving element has the guiding part or the cover element has an inclined surface to avoid a contact between the cover element and the casing of the electronic device (or the base) and avoid a damage of the cover element and the electronic device.

Although the present invention has been described in considerable detail with reference to certain preferred embodiments thereof, the disclosure is not for limiting the scope. Persons having ordinary skill in the art may make various modifications and changes without departing from the scope. Therefore, the scope of the appended claims should not be limited to the description of the preferred embodiments described above.

What is claimed is:

1. A cover assembly applied to an electronic device, wherein the electronic device includes a first component and a second component, the second component has an opening, and the opening is between the first component and the second component, the cover assembly comprising:
    a cover element disposed in the opening, attached to the second component and abutted against the first component;
    at least one first moving element connected to the cover element and including at least one first moving part;
    at least one second moving element connected to the second component and including at least one second moving part, wherein the first moving part is disposed corresponding to the second moving part, and the second moving part guides the first moving part to move; and
    an elastic element connected between the first moving element and the second moving element, wherein when the first component rotates relatively to the second component, the elastic element provides an elastic force to make the cover element continuously abutted against the first component and cover the opening.

2. The cover assembly according to claim 1, wherein the first moving part and the second moving part are a protruding part and a sliding slot, respectively.

3. The cover assembly according to claim 2, wherein the sliding slot includes a guiding part.

4. The cover assembly according to claim 1, wherein the first moving element includes two first moving parts, the second moving element includes two second moving parts, and the first moving parts are disposed corresponding to the second moving parts.

5. An electronic device, comprising:
    a first component;
    a second component having an opening, wherein the opening is between the first component and the second component; and
    a cover assembly including:
    a cover element disposed in the opening, attached to the second component and abutted against the first component;
    at least one first moving element connected to the cover element and including at least one first moving part;
    at least one second moving element connected to the second component and including at least one second moving part, wherein the first moving part is disposed corresponding to the second moving part, and the second moving part guides the first moving part to move; and
    an elastic element connected between the first moving element and the second moving element, wherein when the first component rotates relatively to the second component, the elastic element provides an elastic force to make the cover element continuously abutted against the first component and cover the opening.

6. The electronic device according to claim 5, wherein the first moving part and the second moving part are a protruding part and a sliding slot, respectively.

7. The electronic device according to claim 6, wherein the sliding slot includes a guiding part.

8. The electronic device according to claim 5, wherein the first moving element includes two first moving parts, the second moving element includes two second moving parts, and the first moving parts are disposed corresponding to the second moving parts.

* * * * *